(12) United States Patent
Walter et al.

(10) Patent No.: US 8,604,895 B2
(45) Date of Patent: Dec. 10, 2013

(54) FILTER AND METHOD FOR FILTERING THE SWITCHING NOISE IN A PULSE-WIDTH-MODULATED TRANSMIT SIGNAL

(75) Inventors: Sergio Walter, Villach (AT); Andreas Wiesbauer, Portschach (AT); Giacomo Veranu, Moosburg (AT); Thomas Potscher, Villach (AT)

(73) Assignee: Lantiq Deutschland GmbH, Neubiberg (DE)

( * ) Notice: Subject to any disclaimer, the term of this patent is extended or adjusted under 35 U.S.C. 154(b) by 2267 days.

(21) Appl. No.: 11/474,587

(22) Filed: Jun. 26, 2006

(65) Prior Publication Data
US 2007/0202828 A1    Aug. 30, 2007

(30) Foreign Application Priority Data

Jun. 27, 2005   (DE) .......................... 10 2005 030 048

(51) Int. Cl.
*H03H 7/00*    (2006.01)
(52) U.S. Cl.
USPC ............................. 333/167; 333/177; 333/185

(58) Field of Classification Search
USPC ......................................... 333/167, 177, 185
See application file for complete search history.

(56) References Cited

U.S. PATENT DOCUMENTS 2,612,558 A * 9/1952 Klipsch ............................ 333/5
2005/0093586 A1    5/2005 Karlsson

FOREIGN PATENT DOCUMENTS

DE    2054581 B * 9/1977
GB    2343573    5/2000

OTHER PUBLICATIONS

German Office Action dated Apr. 12, 2006.

* cited by examiner

*Primary Examiner* — Robert Pascal
*Assistant Examiner* — Kimberly Glenn
(74) *Attorney, Agent, or Firm* — SpryIP, LLC

(57) ABSTRACT

Analogue filter for filtering out a high-frequency switching noise in a pulse-width-modulated transmit signal, which is fed into a line by a line driver by means of a transformer, wherein at least one capacitor is connected in parallel to a secondary winding of the transformer and, together with a stray inductivity of the transformer, forms the analogue filter.

50 Claims, 10 Drawing Sheets

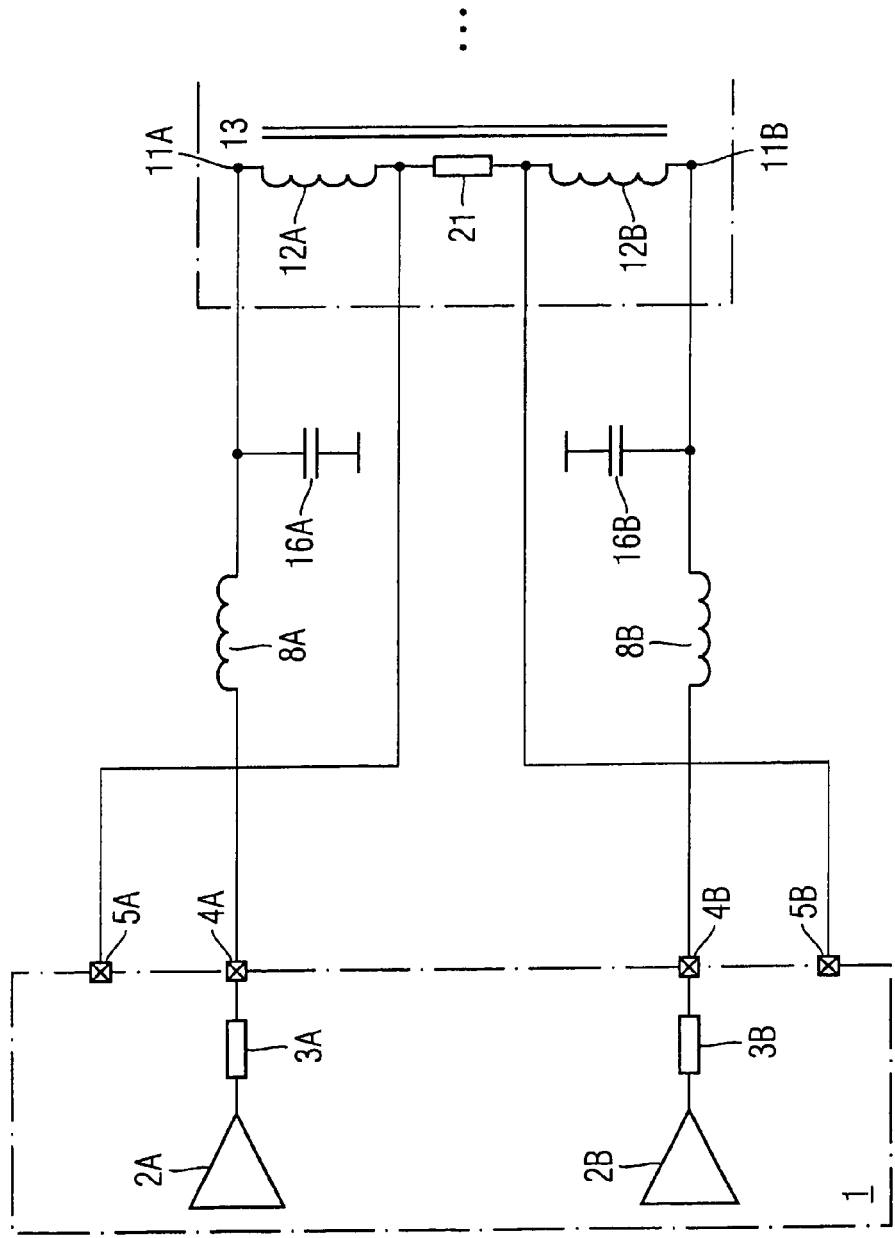

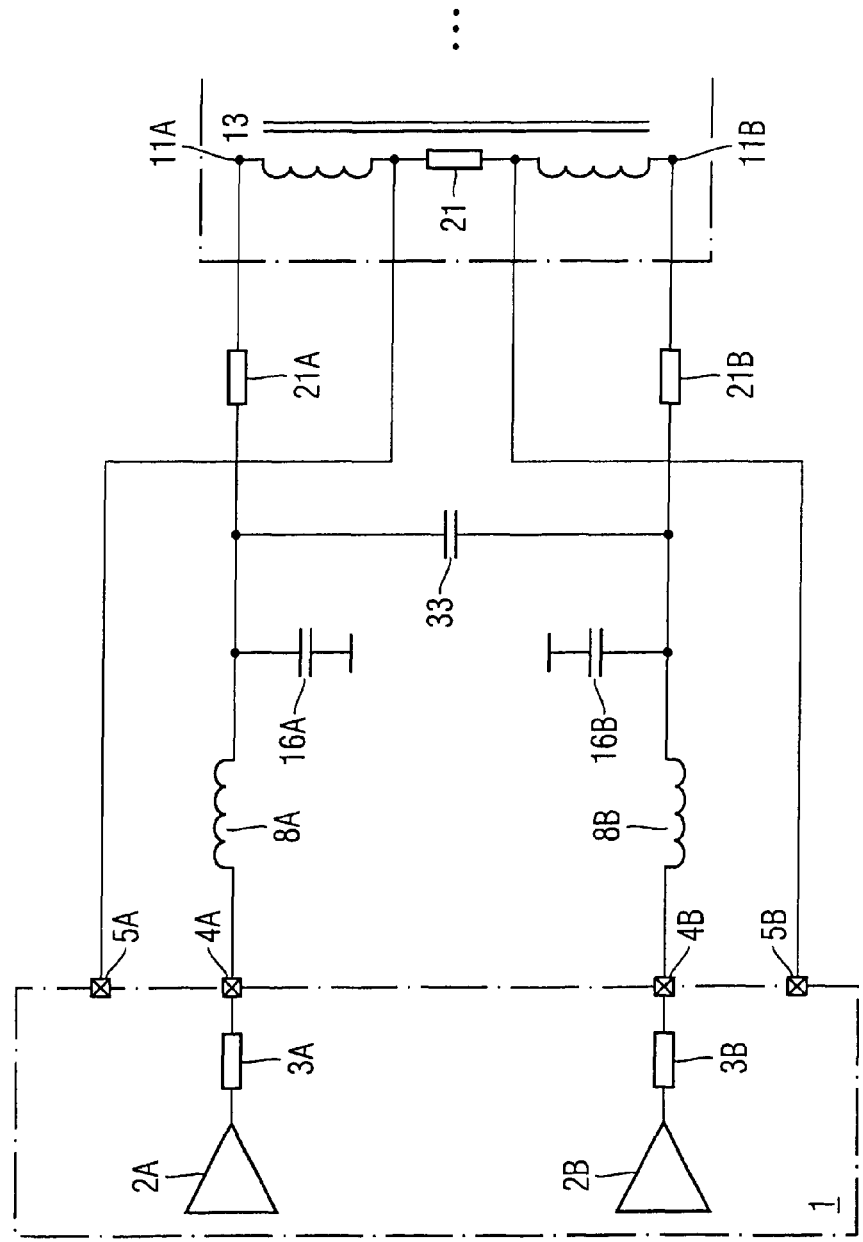

FILTER AND METHOD FOR FILTERING THE SWITCHING NOISE IN A PULSE-WIDTH-MODULATED TRANSMIT SIGNAL

The invention relates to a filter and a method for filtering out a high-frequency switching noise in a pulse-width-modulated transmit signal, which is fed into a line by a line driver by means of a transformer.

xDSL refers to a multiplicity of transmission systems in which data are transmitted via twin copper wires of the telephone subscriber line network. ADSL (Asymmetrical Digital Subscriber Line) data transmission systems in which data are transmitted via twisted two-wire telephone lines to the end subscriber in the local area network for broadband applications are particularly widely used. A distinction is made between various configurations such as ADSL 1, ADSL 2 which differ in their different bit rates in the forward and return channel. In ADSL, the data transmission rates are different, i.e. asymmetric, in the forward and return channel.

Figure 1:
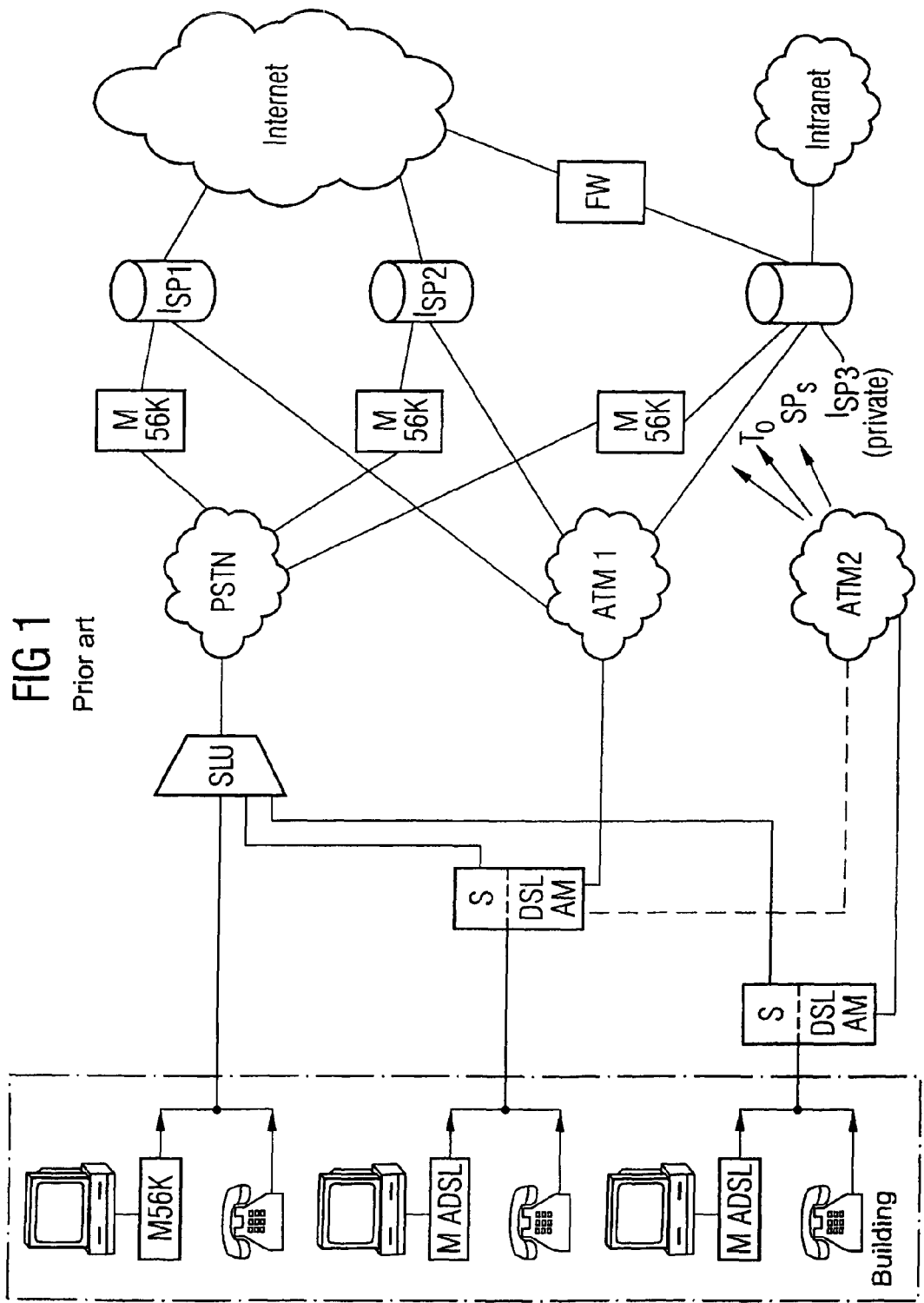

FIG. 1 shows an ADSL broadband access network according to the G. 992.5 standard which is an ADSL data transmission system with discrete multitone transmission (DMT). A number of end users located in a building are connected to conventional public switched telephone networks (PSTN) and to broadband ATM (Asymmetric Transfer Mode) data transmission networks via twisted telephone lines and via DSLAM circuits and subscriber line units (SLU). These networks are connected to the Internet via Internet Service Providers (ISP)

For amplifying the signal at the subscriber or user end and at the exchanges, no line drivers containing so-called class-D amplifiers are yet used at present. Class-D line drivers deliver an amplified pulse-width-modulated transmit signal which is fed into the twisted telephone lines by means of a transformer. The transmit signal must have a power spectral density (PSD) predetermined by the standard, i.e. the spectrum of the transmit signal must lie within a predetermined spectral mask.

Figure 2:
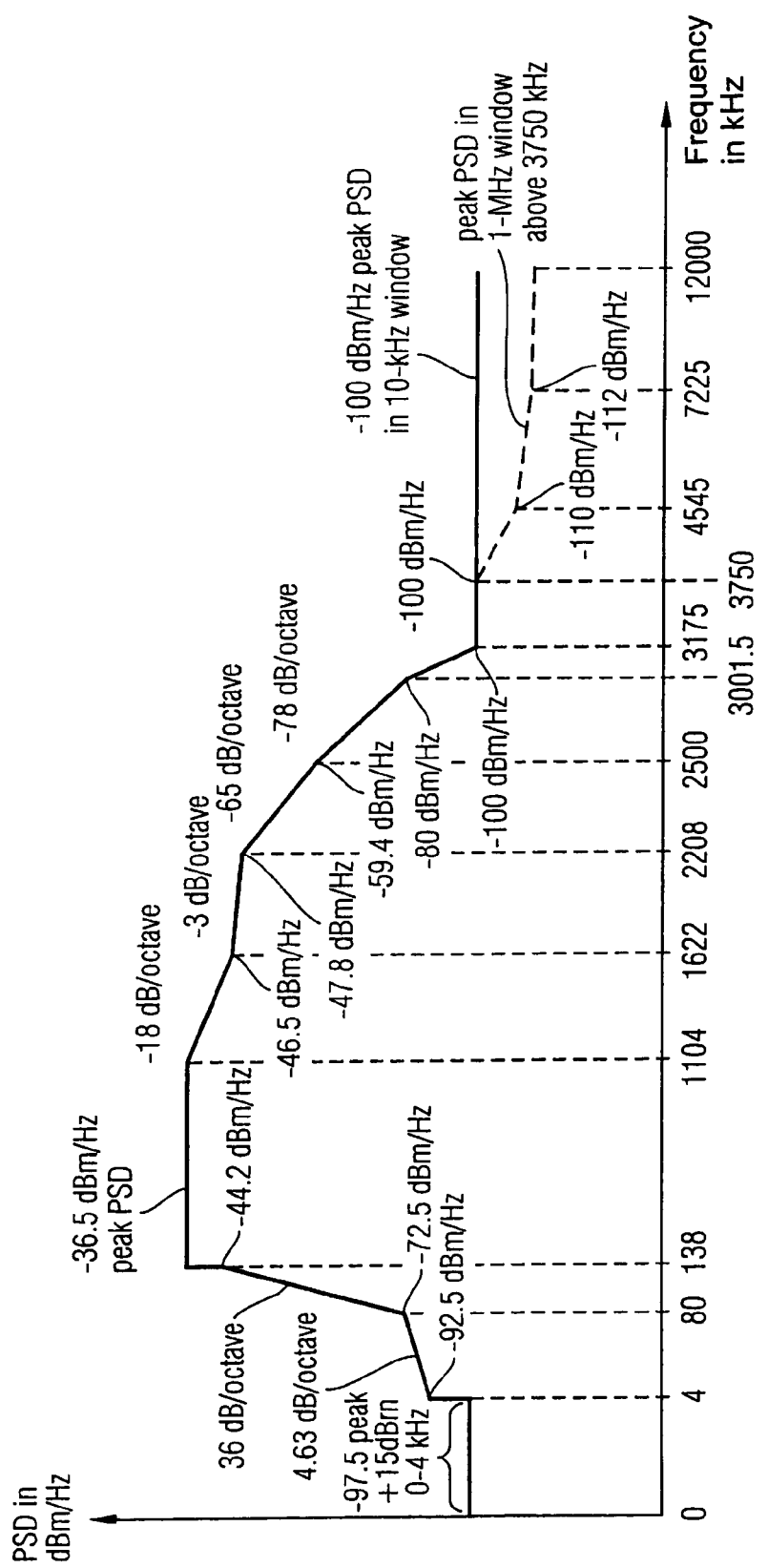

FIG. 2 shows the spectral power mask predetermined by the G. 99.2 standard. The transmit signal delivered by the line driver must lie beneath the line represented in FIG. 2. To suppress the high-frequency switching noise contained in the pulse-width-modulated transmit signal, so-called OOB (Out-of-Band) filters are therefore used, which attenuate the high-frequency signal components of the pulse-width-modulated transmit signal in order to stay within the PSD mask as shown in FIG. 2.

Figure 3:
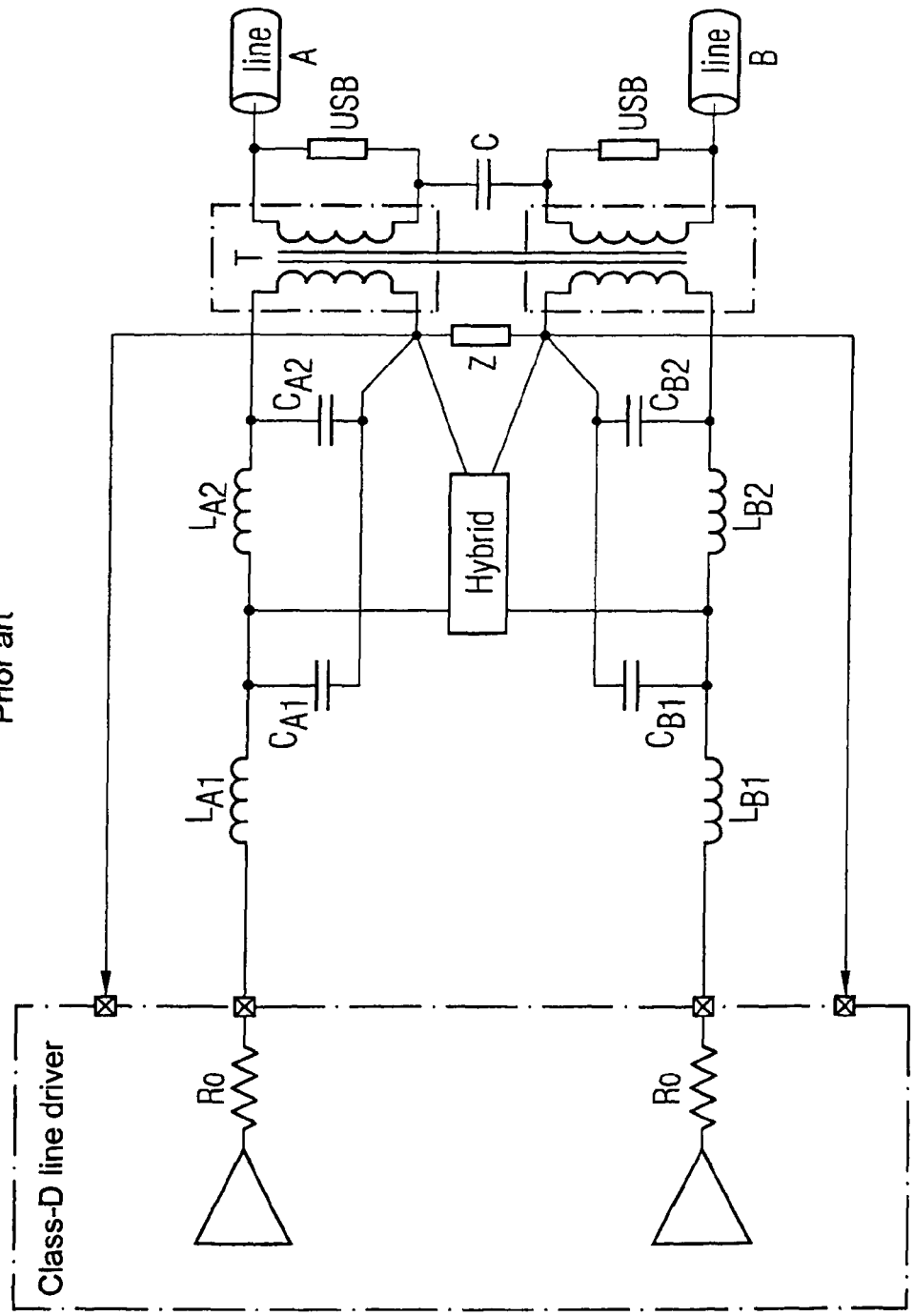

FIG. 3 shows a conventional circuit arrangement within which a class-D line driver is followed by a conventional OOB filter. The class-D line driver has a differential structure and outputs via two parasitic output resistances $R_O$ a pulse-width-modulated (PWM) transmit signal which is fed into a twisted two-wire telephone line via at least one associated transformer T. The transformer T has four windings, namely two primary windings and two secondary windings. The primary coils of the transformer T are connected via a complex impedance Z to which a hybrid circuit is connected for echo signal compensation. The secondary coils of the transformers are connected to one another via a capacitor. Overvoltage protection components for protecting the transformer against overvoltages are connected in parallel with the secondary coils of the transformers. The overvoltage protection components are formed, for example, by varistors or thyristors. The overvoltage protection components protect the transformer, for example, against overvoltages which are caused by a lightning strike. The analogue OOB filter is a low-pass filter for filtering out a high-frequency switching noise of the pulse-width-modulated transmit signal delivered by the line driver. The conventional analogue low-pass filter shown in FIG. 3 is a fifth-order low-pass filter which has two inductances LA1, LA2 and LB1, LB2, respectively, and two capacitors CA1, CA2 and CB1, CB2, respectively, on the side of the primary windings of the transformer T. In addition, the OOB filter comprises the stray inductances of the transformer T. The cut-off frequency of the analogue low-pass filter depends on the ADSL standard used. The cut-off frequency is 2.4 MHz with ADSL plus and 1.1 MHz with conventional ADSL. The switching frequency caused by the class-D amplifier is typically 10 MHz. FIG. 3 shows the dimensioning of the coils and of the capacitors for a cut-off frequency of 2.4 MHz. The coils LA1, LB1 in each case have an inductance of 1.8 µH. The coils LA2, LB2 have an inductance of 1.5 µH. The capacitors CA1, CB2 have a capacitance of 6.8 nF and the capacitors CA2, CB2 also have a capacitance of 6.8 nF.

The circuit arrangement with a conventional OOB low-pass filter, shown in FIG. 3, has some disadvantages.

A main disadvantage is that the conventional analogue low-pass filter contains inductances which cannot be easily integrated and require relatively much space during the assembly. Since the circuit has a symmetric structure, the coils used in each case in the two signal branches A, B must have identical inductances and be well matched. For example, the coil LA1 and the coil LB1 must have an inductance of 1.8 µH which is identical, if possible. Similarly, the coils LA1, LB2 must have an identical inductance of 1.5 µH.

Due to the symmetric structure and to the resultant need for the coils to be matched, the coils LA1, LA2, LB1, LB2 are only permitted to have slight manufacturing tolerances so that the costs for producing these highly accurate coils are relatively high.

A further disadvantage is that the coils LA1, LA2, LB1, LB2 in the conventional OOB filter shown in FIG. 3 in each case need separate shielding against electromagnetic radiation.

A further disadvantage of the OOB filter shown in FIG. 3 is that the capacitances of the capacitors used are relatively high with 6.8 nF. This leads to relatively large capacitors having to be used which require correspondingly more space during the assembly.

The invention provides an analogue filter for filtering out a high-frequency switching noise in a pulse-width-modulated transmit signal, which is fed into a line from a line driver by means of a transformer, wherein a capacitor is connected in parallel to a secondary coil of said transformer and forms the analogue filter together with a stray inductivity of said transformer.

The invention also provides an analogue filter for filtering out a high-frequency switching noise in a pulse-width-modulated transmit signal, which is fed into a line by a line driver by means of a transformer, the analogue filter comprising a common-mode choke, which receives the transmit signal from the line driver and delivers it to a first terminal of a primary winding of the transformer, wherein at least one further capacitor is provided, which is interconnected between the first terminal of the primary winding of the transformer and a reference potential terminal.

In one embodiment of the analogue filter according to the invention, an overvoltage protection component is connected in parallel with the capacitor.

In one embodiment of the analogue filter according to the invention, the overvoltage protection components are varistors.

In an alternative embodiment of the analogue filter according to the invention, the overvoltage protection components are thyristors.

In one embodiment of the analogue filter according to the invention, the analogue filter has a differential structure.

In one embodiment of the analogue filter according to the invention, the filter has a differential structure and comprises a coil pair contained in the common-mode choke as well as a first capacitor pair including two first capacitors to form a filter of third order and optionally a second capacitor pair including two second capacitors to form a filter of fourth order.

In one embodiment of the analogue filter according to the invention, the filter has a differential structure, and a corresponding transformer winding is provided for each of the two telephone line wires.

In one embodiment of the analogue filter according to the invention, the two transformers each comprise a primary coil whose first terminal is respectively connected directly to the two capacitors of the first capacitor pair and whose two second terminals are connected to one another via a complex terminating impedance.

In an alternative embodiment of the analogue filter according to the invention, the transformer includes two primary coils, whose second terminals are short-circuited and whose first terminals are each connected via a complex terminating impedance with one of the capacitors of the first capacitor pair.

In one embodiment of the analogue filter according to the invention, the transformer comprises two secondary coils, which are connected with each other via a third capacitor.

In one embodiment of the analogue filter according to the invention, the reference potential terminal is a ground terminal.

Figure 4:
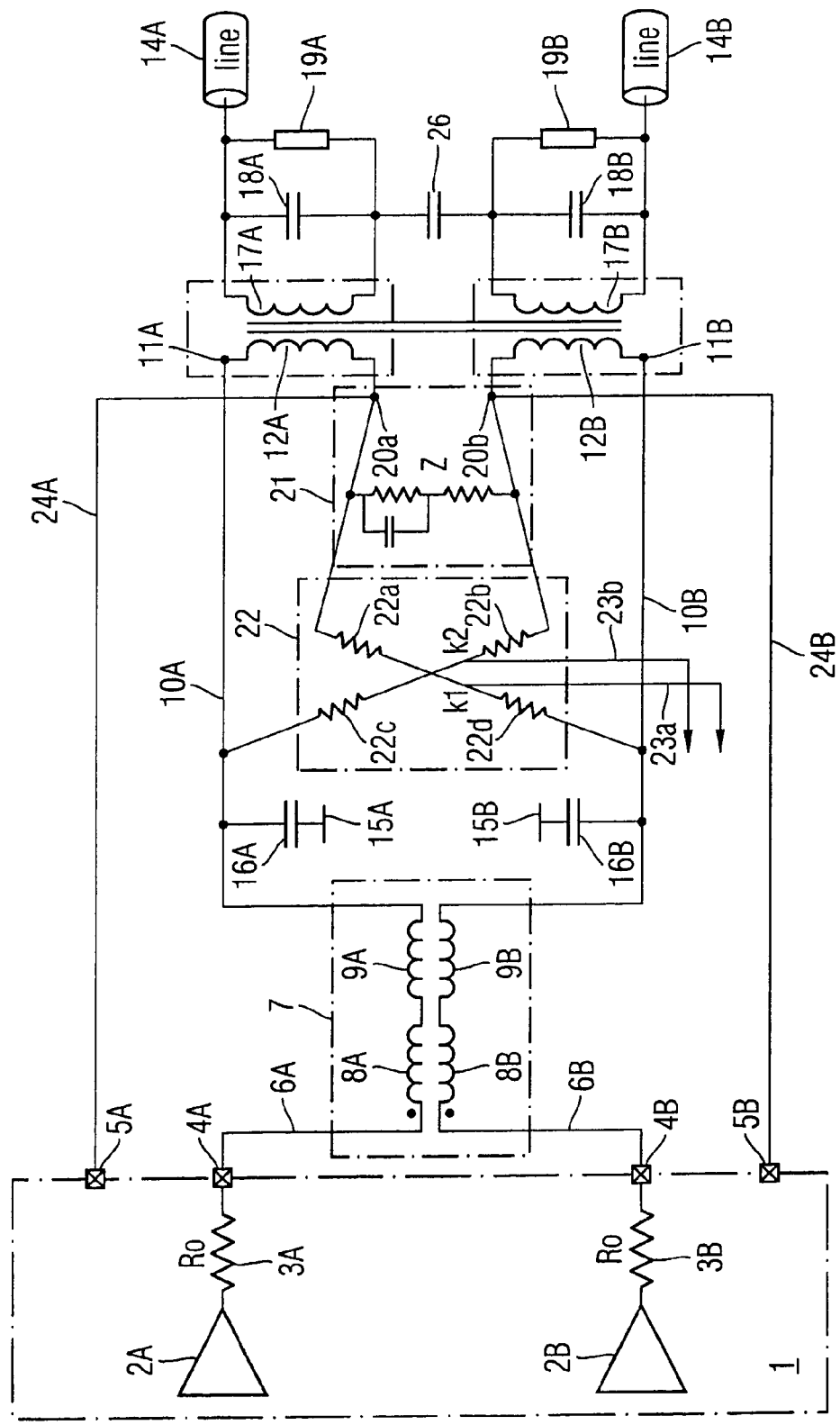
Figure 5:
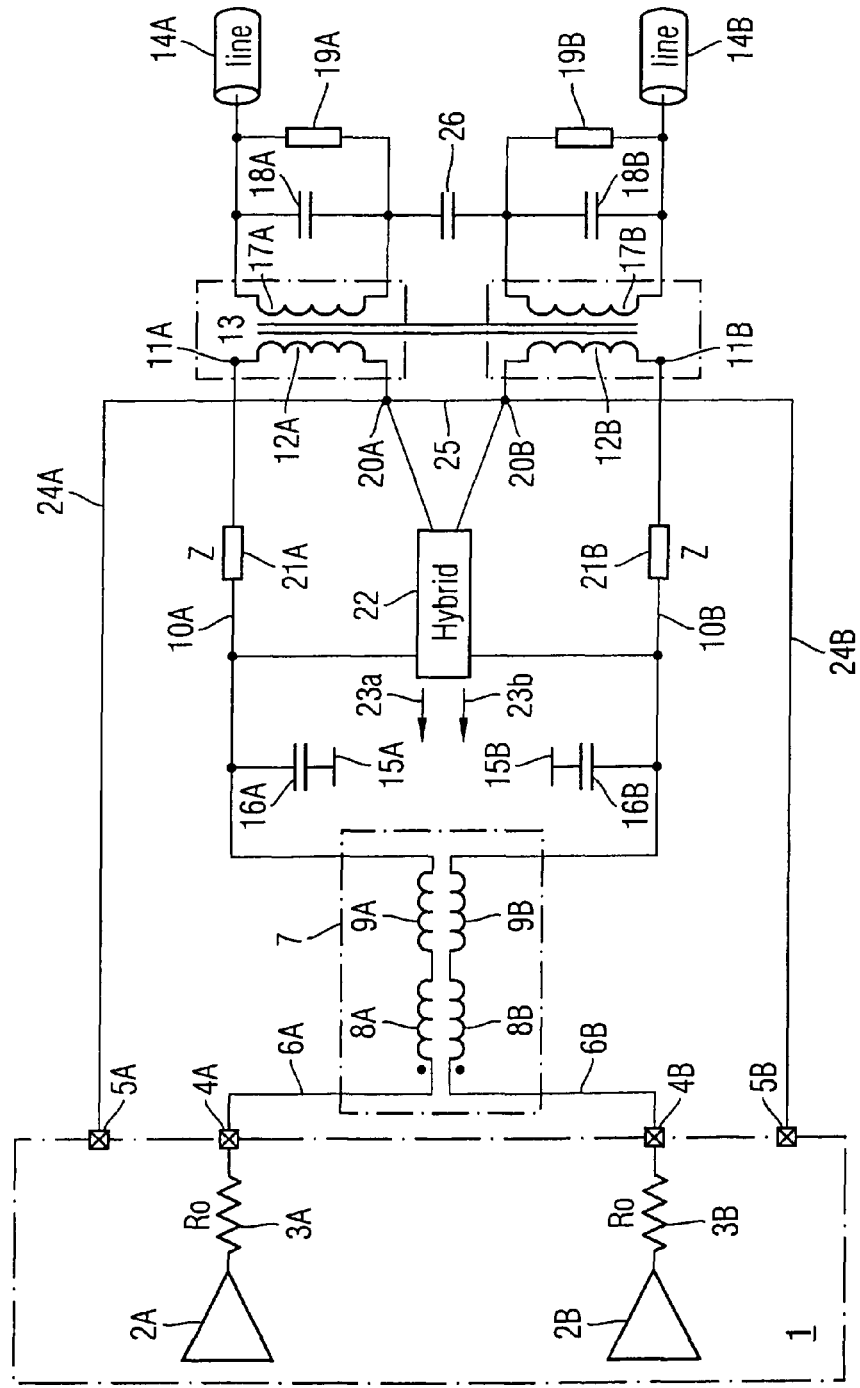

In the text which follows, preferred embodiments of the analogue filter and the method according to the invention are described for explaining features essential to the invention, referring to the attached figures, in which:

FIG. 1: shows an ADSL broadband access network according to the prior art;

FIG. 2: shows a spectral power mask as is specified for the ADSL transmission according to the standard;

FIG. 3: shows a conventional analogue low-pass filter for filtering out a high-frequency switching noise in a pulse-width-modulated transmit signal;

FIG. 4: shows an embodiment of the analogue filter according to the invention;

FIG. 5: shows a further embodiment of the analogue filter according to the invention.

Figure 6:
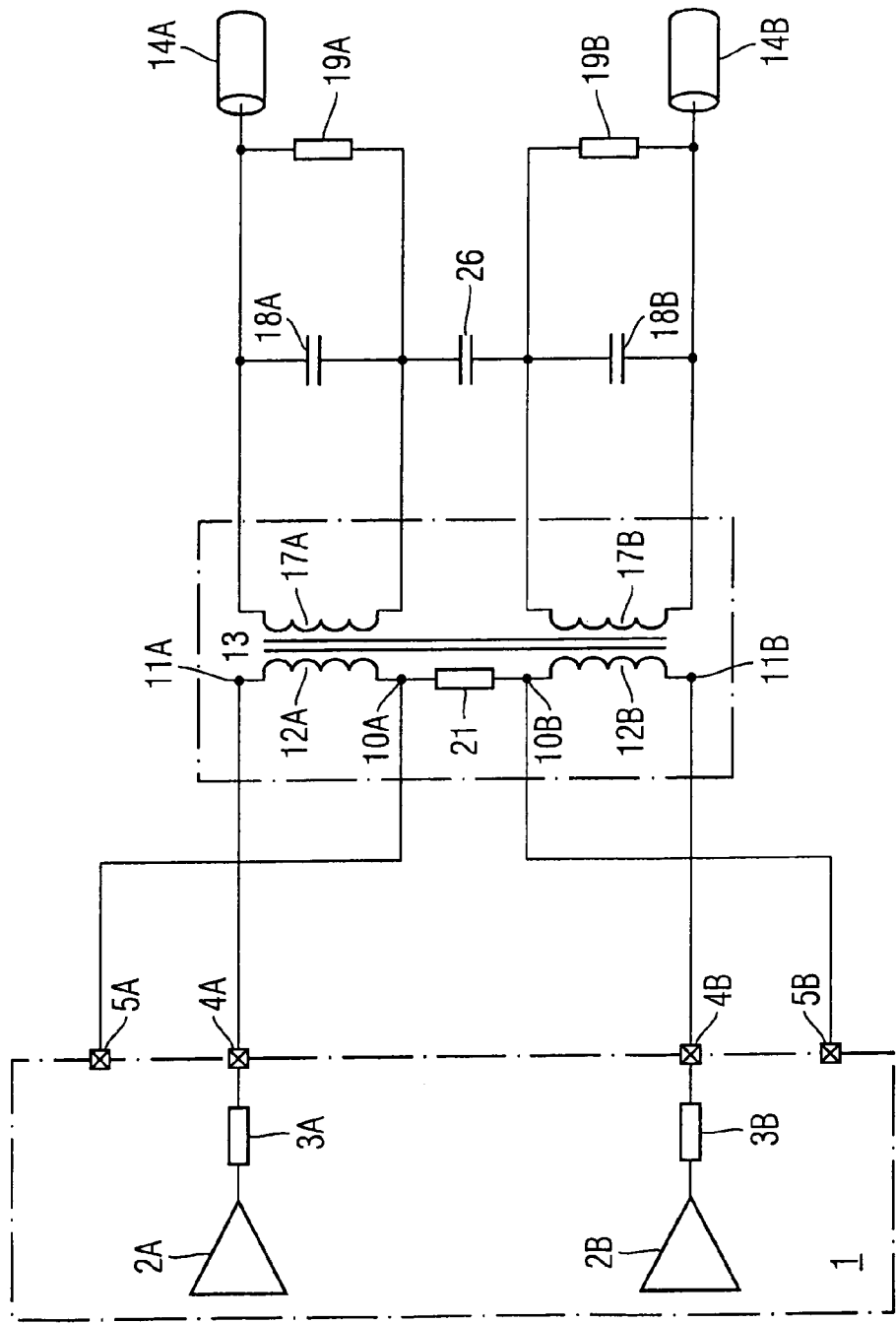

FIG. 6: shows a further embodiment of the analogue filter according to the invention.

Figure 7:
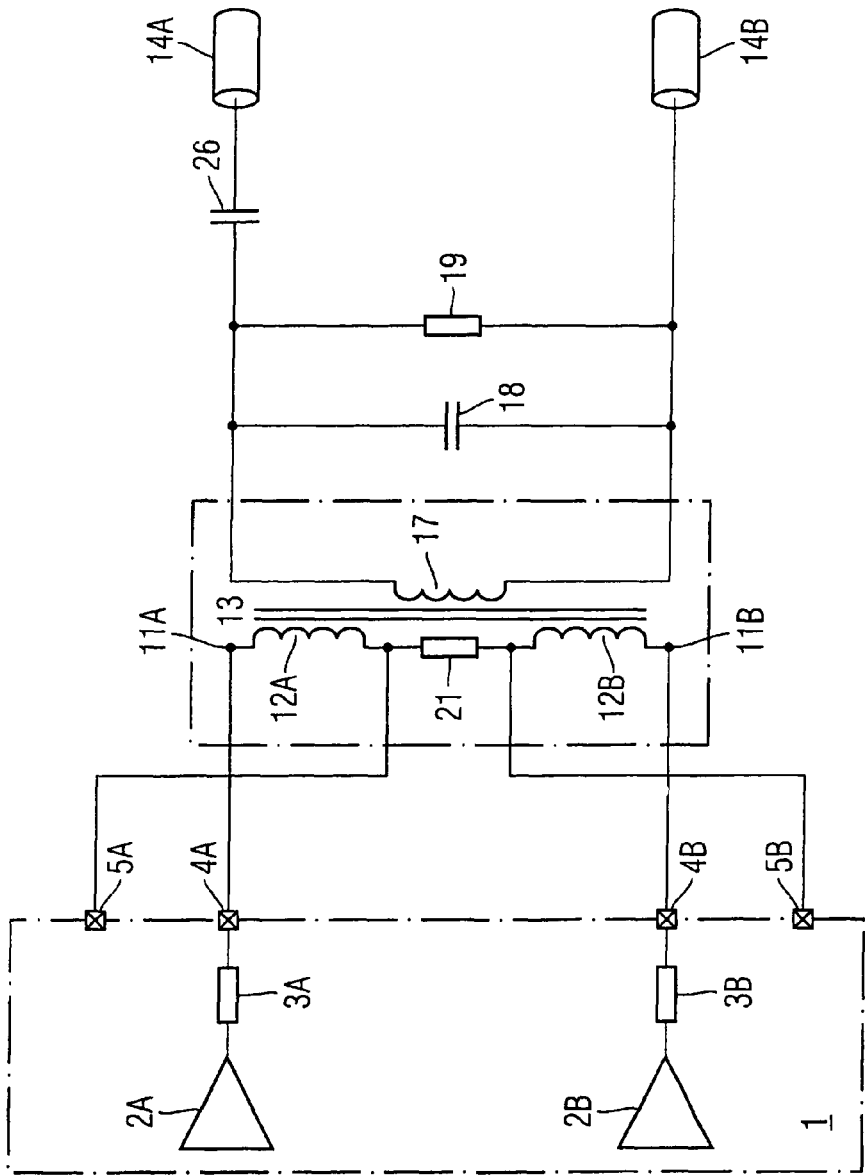

FIG. 7: shows a further embodiment of the analogue filter according to the invention.

Figure 8:
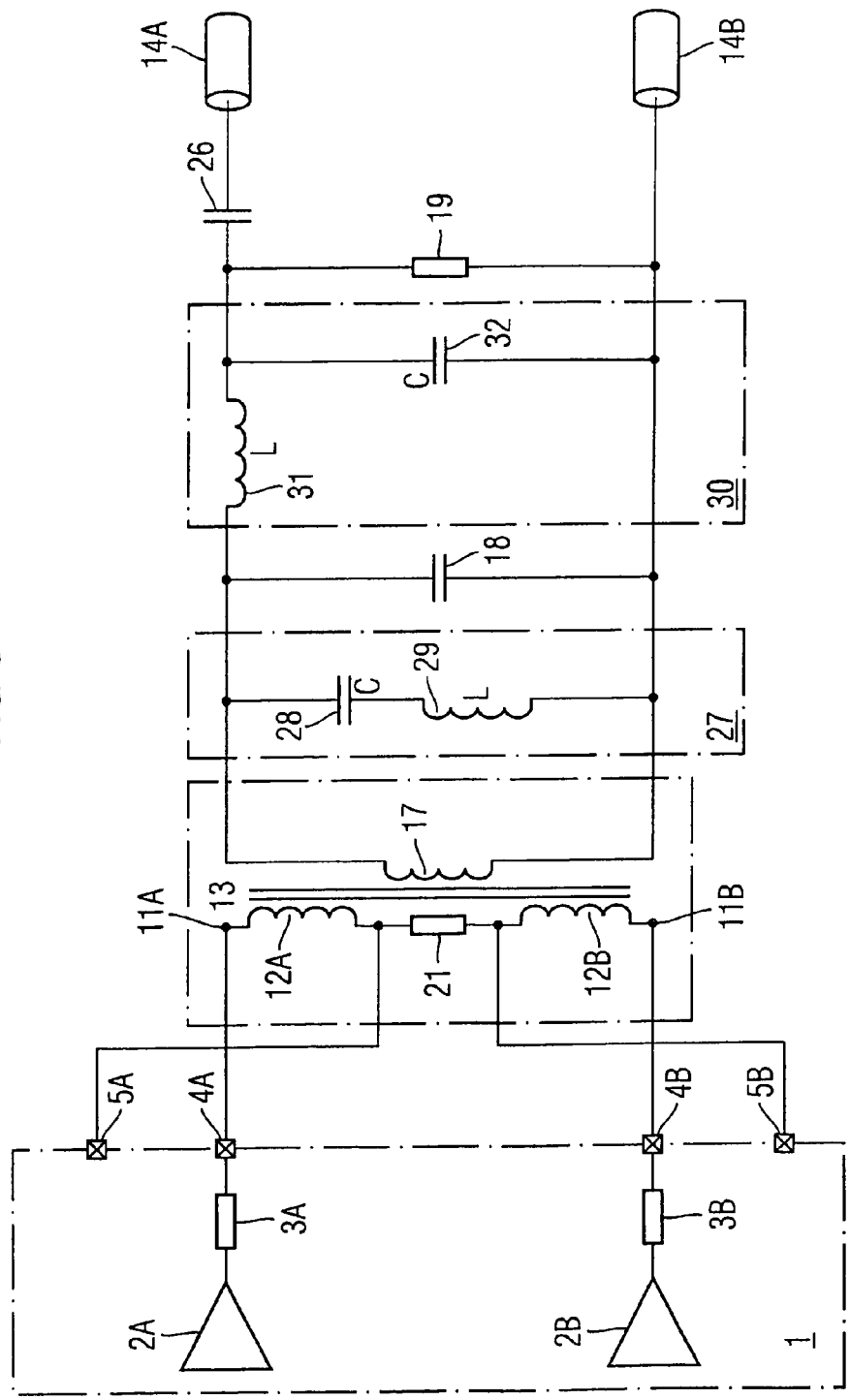

FIG. 8: shows a further embodiment of the analogue filter according to the invention.

FIG. 9: shows a further embodiment of the analogue filter according to the invention.

FIG. 10: shows a further embodiment of the analogue filter according to the invention.

As can be seen from FIG. 4, a class-D line driver has a differential structure and contains two output driver stages 2A, 2B. The driver stages 2A, 2B are connected to output terminals 4A, 4B of a line driver 1, in particular a class-D line driver 1, via a parasitic output resistance 3A, 3B. The class-D line driver 1 delivers a differential amplified pulse-width-modulated transmit signal via the two output terminals 4A, 4B. The class-D line driver 1 also contains input terminals 5A, 5B for impedance synthesis. The output terminals 4A, 4B are connected to a common-mode choke 7 via lines 6A, 6B. The common-mode choke (CMC) 7, or CMC circuit, is a standard component which is normally used for suppressing common-mode signals on voltage supply lines. The common-mode choke 7 contains a pair of coils 8A, 8B which are accommodated in a shielded housing. In a preferred embodiment, the two coils 8A, 8B within the common-mode choke 7 have a nominal inductance of 14 µH. In series with the inductances 8A, 8B, serially interconnected parasitic stray inductances 9A, 9B having an inductance of, for example, 1.3 µH are shown in FIG. 4. The parasitic inductances 9A, 9B of the common-mode choke 7, together with the capacitors 16A, 16B, form a differential low-pass filter. The main inductances 8A, 8B of the common-mode choke 7 together with the capacitances 16A, 16B, form a low-pass filter for a common-mode input signal.

The common-mode choke 7 receives the pulse-width-modulated transmit signal from the class-D line driver 1 and, in the embodiment shown in FIG. 4, delivers it via lines 10A, 10B, respectively, to a first terminal 11A, 11B of a primary winding 12A, 12B of a transformer 13. The circuit arrangement shown in FIG. 4 has a fully differential structure so that for each of the two telephone line wires 14A, 14B, an associated transformer winding 17A, 17B is provided. The transformer 13 has four windings, namely two primary windings 12A, 12B and two secondary windings 17A, 17B, which are magnetically coupled.

In an alternative embodiment, two separate transformers are provided, the secondary windings 17A, 17B of which are each connected to a telephone wire 14A, 14B.

At least one first capacitor 16A, 16B is interconnected between the first terminal 11A, 11B of the two primary windings 12A, 12B of the transformer 13 and a reference potential terminal 15A, 15B. The reference potential terminal 15A, 15B is preferably formed by an earth connection in each case.

The transformer 13 has secondary windings 17A, 17B to which at least one second capacitor 18A, 18B is connected in parallel. Additionally, one overvoltage protection component 19A, 19B is preferably connected in parallel with each of the secondary windings 17A, 17B and the capacitors 18A, 18B. The overvoltage protection components 19A, 19B are preferably varistors or thyristors. The overvoltage protection components 19A, 19B are provided for protecting the transformer 13 against overvoltages, for example in case of a lightning strike. Since the capacitors 18A, 18B are also connected in parallel with the overvoltage protection components 19A, 19B and the secondary windings 17A, 17B of the transformer 13, the overvoltage protection components 19A, 19B also protect the capacitors 18A, 18B against overvoltages. It is thus not necessary to use high-voltage components for the capacitors 18A, 18B in the circuit arrangement according to the invention so that these capacitors can be produced with very low manufacturing costs and have good filtering characteristics.

In the first embodiment shown in FIG. 4, the transformer 13 has two primary coils 12A, 12B, the first terminal of which is directly connected to the two capacitors 16A, 16B of the first pair of capacitors and the second terminals 20A, 20B of which are connected to one another via a complex terminating impedance 21. As shown in FIG. 4, the complex terminating impedance 21 is preferably formed by two series-connected resistors, a capacitor being connected in parallel with one of the two resistors. Furthermore, a hybrid circuit 22 which contains four resistors 22A, 22B, 22C, 22D is connected to the terminals 20A, 20B. The resistors are cross-connected, the second terminal 20A of the primary winding 12A being connected to the line 10B via resistors 22A, 22D and the second terminal 20B of the secondary winding 12B being connected to line 10A via resistors 22B, 22C. The receive signal for the receiver is picked up via lines 23A, 23B at a first node K1 located between the resistors 20A, 20D and at a second node K2 located between the resistors 22B, 22C.

In addition, the second terminals 20A, 20B of the secondary windings 12A, 12B are connected via feedback lines 24A, 24B to the terminals 5A, 5B of the class-D line driver 1 for impedance synthesis.

The transformer 13 has two secondary coils 17A, 17B which are connected to one another via a third capacitor 26.

In the embodiment shown in FIG. 4, the conventional analogue low-pass filter is formed by the common-mode choke 7, by the two capacitors 16A, 16B of the first pair of capacitors 16 and by the two second capacitors 18A, 18B of the second pair of capacitors 18 and by the stray inductances of the transformer 13. The common-mode choke 7, the first pair of capacitors 16, the second pair of capacitors 18 and the stray inductance of the transformer 13 form a passive fourth-order analogue low-pass filter. This analogue low-pass filter has a differential structure and is protected against overvoltages on the secondary side of the transformer 13 by the overvoltage protection components 19A, 19B. Since the coils 8A, 8B are integrated in one component within the common-mode choke 7, the coils 8A, 8B are very well matched. In addition, the coils 8A, 8B are well shielded against electromagnetic irradiation within the common-mode choke 7.

In one particular embodiment, the cut-off frequency of the analogue low-pass filter is at a frequency of 2.4 MHz. The first capacitors 16A, 16B have a capacitance of 8.2 nF and the second capacitors 18A, 18B have a capacitance of 2.2 nF. In one particular embodiment, the capacitors 18A, 18B have a capacitance of less than 2.5 nF, and preferably less than 2.2 nF. In one embodiment, the capacitors 18 are low-voltage capacitors.

The analogue low-pass filter can be implemented with a very small number of external components. In particular, the use of the common-mode choke 7, which is available as a standard component, provides the possibility of minimizing the costs for the circuitry. Since the number of external components which are not integrated is minimal, the space required for these components is also small.

Furthermore, the total capacitance of the capacitors 16A, 16B used and of the capacitors 18A, 18B is lower than in the conventional circuit arrangement as shown in FIG. 3. The sum of the capacitances of the two capacitors 16A, 18A (8.2 nF+2.2 nF) is 10.4 nF, whereas the sum of the capacitances of the capacitors CA1, CA2 in the conventional circuit arrangement shown in FIG. 3 is 2×6.8 nF=13.6 nF.

Furthermore, the analogue low-pass filter requires no independent coil components. Whereas the conventional circuit arrangement as shown in FIG. 3 comprises four coils LA1, LA2, LB1, LB2, the circuit arrangement according to the shown embodiment of the invention only requires two coils 8A, 8B which are integrated within the common-mode choke 7.

The common-mode choke 7 provides a very high attenuation for a CMC signal at a frequency of 10 MHz. According to the specification or the standard, this frequency requires an attenuation of −90 dB. At a frequency of 20 MHz, an attenuation of −72 dB is required. The analogue low-pass filter achieves the necessary attenuation with minimum circuitry costs.

FIG. 5 shows a further embodiment, in which the second terminals 20A, 20B of the primary windings 12A, 12B of the transformer 13 are short-circuited via a line 25. Instead, complex terminating impedances 21A, 21B, which also preferably consist of two series-connected resistors and one capacitor being connected in parallel with one resistor as shown in FIG. 4, are respectively interconnected in lines 10A, 10B.

In another alternative embodiment, the analogue low-pass filter is formed by the common-mode choke 7, the capacitors 16A, 16B and by the stray inductances of the transformer 13, and represents a third-order low-pass filter. Such an analogue low-pass filter is suitable, in particular, for a line driver 1 which is clocked with a very high frequency.

FIG. 6 shows a further embodiment of an analogue low-pass filter in accordance with the present invention. In the embodiment shown in FIG. 6, the primary side of the transformer 13 is connected directly to the output terminals 4A, 4B of the class-D line driver 1. In the embodiment shown in FIG. 6, the transformer 13 includes two primary windings 12A, 12B, whose first terminals 11A, 11B are directly connected to the output terminals 4A, 4B and whose second terminals 20A, 20B are connected to each other via a complex terminating impedance 21. The transformer 13 further includes two secondary windings 17A, 17B. Connected in parallel to each of the two secondary windings 17A, 17B is a capacitor 18A, 18B, which, together with the parasitic stray inductivities of the transformer 13, forms an analogue low-pass filter, which filters out the high-frequency switching noise of the pulse-width-modulated transmit signal, which is fed from the class-D line driver 1 via the transformer 13 into the telephone line 14A, 14B. The parasitic stray inductivities are caused by a non-ideal coupling of the primary and secondary windings of the transformer 13. Together with the capacitors 18A, 18B, the parasitic stray inductivities form an analogue low-pass filter for filtering out the high-frequency switching noise overvoltage protection components 19A, 19A are respectively connected to the capacitors 18A, 18B. These overvoltage protection components 19A, 19B are constituted by varistors or thyristors, for example. In one embodiment, the capacitors 18A, 18B have a capacitance of several nF, for example 2.2 nF. In one embodiment, the capacitors 18 have a capacitance of less than 2.5 nF. The capacitance of the capacitor 16 is for example about 22 nF. In the embodiment shown in FIG. 6, the number of external components outside of the class-D line driver 1 and the transformer 13 is minimal. The parasitic stray inductivity of the transformer 13, which by itself is undesirable, is used in the configuration of the analogue low-pass filter for filtering the high-frequency switching noise.

FIG. 7 shows a further embodiment of the inventive analogue low-pass filter. As can be seen from FIG. 7, the circuit arrangement shown in FIG. 7 is not symmetrical, since the capacitor 26 is connected in series with the line 14A. In the embodiment shown in FIG. 7, the capacitor 26 has a capacitance of about 44 nF, for example. In an alternative embodiment, a corresponding capacitor that is connected in series with the line 14B may be provided optionally.

FIG. 8 shows a further embodiment of an inventive analogue low-pass filter. In this embodiment, a series oscillating circuit 27, which is also referred to as absorption circuit, is connected in parallel to the secondary winding 17 of the transformer 13. The series oscillating circuit 27 includes a capacitor 28 and a coil 29 connected in series therewith. In a preferable embodiment, the resonance frequency of the series oscillating circuit 27 is within the frequency range of the switching frequency of the class-D line driver 1. At the resonance frequency, the complex resistance of the resonance oscillating circuit 27 approaches zero, so that the oscillating circuit 27 acts as a short-circuit in this frequency range and suppresses the switching noise. The resonance oscillating circuit 27 is connected in parallel to the capacitor 18. In the embodiment shown in FIG. 8, an additional low-pass filter 30 having a coil 31 and a capacitor 32 may be optionally provided. Furthermore, an overvoltage protection component 19 is connected in parallel to the secondary winding 17 of the transformer 13. In the embodiment shown in FIG. 8, the input side of the transformer 13 is connected directly to the class-D line driver 1.

FIG. 9 shows a further embodiment of an inventive analogue low-pass filter. In this embodiment, the transformer 13 is not connected directly on its primary side to the class-D line driver 1, but via two separate coils 8A, 8B as well as a pair of capacitors 16A, 16B. On the secondary side of the transformer 13, the circuit variations shown in the FIGS. 6, 7 and 8 are possible.

FIG. 10 shows a further embodiment of an inventive low-pass filter, in which additional complex terminating impedances 21A, 21B as well as a differential capacitor 33 are provided. The separate coils 8A, 8B shown in FIGS. 9 and 10 have an inductivity of several µH, for example 2 µH. The capacitors 16A, 16B shown in FIGS. 9 and 10 have a capacity of several nF, for example 4 nF.

The filter according to the present invention is not limited to connecting telephone lines and may be applied to any kind of line.

What is claimed is:

1. Analogue filter for filtering out a high-frequency switching noise in a pulse-width-modulated transmit signal, which is fed into a line by a line driver by means of a transformer, wherein at least one capacitor is connected in parallel to a secondary winding of the transformer and, together with a stray inductivity of the transformer, forms the analogue filter.

2. Analogue filter according to claim 1, wherein an overvoltage protection component is connected in parallel with the capacitor.

3. Analogue filter according to claim 2, wherein the overvoltage protection component is a varistor.

4. Analogue filter according to claim 2, wherein the capacitor is a low-voltage capacitor.

5. Analogue filter according to claim 1, wherein the overvoltage protection component is a thyristor.

6. Analogue filter according to claim 1, wherein the line driver is a class-D line driver.

7. Analogue filter according to claim 1, wherein a series oscillating circuit is connected in parallel to the capacitor.

8. Analogue filter according to claim 7, wherein the series oscillating circuit comprises a capacitor and a coil connected in series therewith.

9. Analogue filter according to claim 8, wherein a resonance frequency of the series oscillating circuit corresponds to a switching frequency of the line driver.

10. Analogue filter according to claim 1, comprising a common-mode choke, which receives the transmit signal from the line driver and delivers it to a first terminal of a primary winding of the transformer.

11. Analogue filter according to claim 10, comprising at least one capacitor, which is interconnected between the first terminal of the primary winding of the transformer and a reference potential terminal.

12. Analogue filter according to claim 11, wherein the transformer comprises two primary windings, whose respective first terminals are connected directly with a capacitor and whose second terminals are connected with each other via a complex terminating impedance.

13. Analogue filter according to claim 11, wherein the transformer comprises two primary windings, whose second terminals are short-circuited and whose respective first terminals are each connected via a complex terminating impedance with a capacitor.

14. Analogue filter according to claim 11, wherein the transformer comprises another secondary winding, the another secondary winding coupled to the secondary winding via a third capacitor.

15. Analogue filter according to claim 11, wherein the reference potential terminal is formed by a ground terminal.

16. Analogue filter according to claim 11, wherein the at least one capacitor, which is interconnected between the first terminal of the primary winding of the transformer and the reference potential terminal, has a capacitance of less than 2.5 nF.

17. Analogue filter according to claim 10, wherein the common-mode choke includes a pair of coils.

18. Analogue filter according to claim 1, wherein the transmit signal is supplied from the line driver via a separate coil to a first terminal of a primary winding of the transformer.

19. Analogue filter according to claim 1, wherein the analogue filter has a differential structure.

20. Analogue filter for filtering out a high-frequency switching noise in a pulse-width-modulated transmit signal, which is fed into a line by a line driver by means of a transformer, comprising:
(a) a common-mode choke, which receives the transmit signal from the line driver and delivers it to a first terminal of a primary winding of the transformer; and
(b) at least one capacitor, which is interconnected between the first terminal of the primary winding of the transformer and a reference potential terminal.

21. Analogue filter according to claim 20, wherein at least one further capacitor is provided which is connected in parallel with a secondary winding of the transformer, the secondary winding being connected to the line.

22. Analogue filter according to claim 21, wherein an overvoltage protection component is connected in parallel with the further capacitor.

23. Analogue filter according to claim 22, wherein the overvoltage protection component is a varistor.

24. Analogue filter according to claim 22, wherein the overvoltage protection component is a thyristor.

25. Analogue low-pass filter according to claim 21, wherein the further capacitor is a low-voltage capacitor.

26. Analogue low-pass filter according to claim 21, wherein the capacitor has a capacitance of less than 2.5 nF.

27. Analogue filter according to claim 20, wherein the analogue filter has a differential structure.

28. Analogue filter according to claim 20, wherein the analogue filter is a passive filter of third order or higher order.

29. Analogue filter according to claim 28, wherein the analogue filter with differential structure has a pair of coils contained in the common-mode choke and a first pair of capacitors including two first capacitors.

30. Analogue filter according to claim 29, wherein, in the analogue filter of differential structure, a corresponding transformer winding is provided for each of a plurality of telephone line wires of the line.

31. Analogue filter according to claim 30, wherein the transformer comprises two primary coils, whose first terminals are respectively connected to one of the two capacitors of the first pair of capacitors and whose two second terminals are connected to one another via a complex terminating impedance, the two primary coils including the primary coil.

32. Analogue filter according to claim 30, wherein the transformer comprises two primary windings, whose second connections are short-circuited and whose first connections are respectively connected to one of the two capacitors of the first pair of capacitors via a complex terminating impedance, the two primary windings including the primary winding.

33. Analogue filter according to claim 30, wherein the transformer comprises two secondary windings, which are connected to one another via a third capacitor.

34. Analogue low-pass filter according to claim 20, wherein the line driver is a class-D line driver.

35. Analogue low-pass filter for filtering out a high-frequency switching noise in a pulse-width-modulated transmit signal, which is fed into a line by a line driver by means of a transformer, wherein at least one capacitor is connected in parallel to a secondary winding of the transformer and, wherein an overvoltage protection component is connected in parallel to the capacitor.

36. System for feeding signals into a line, the system comprising a transformer, an analogue filter comprising a capacitor that is connected in parallel to a secondary winding of the transformer, and an overvoltage protection component, which is connected in parallel to the capacitor.

37. System according to claim 36, wherein the system is coupled to a class-D line driver.

38. System according to claim 36, wherein the transformer is connected to a telephone line.

39. System according to claim 36, wherein the analogue filter is an analogue low-pass filter for filtering out a high-frequency switching noise in a pulse-width-modulated transmit signal.

40. System according to claim 36, wherein the capacitor is a low-voltage capacitor.

41. System according to claim 36, wherein the capacitor has a capacitance of less than 2.5 nF.

42. Analogue low-pass filter for filtering out a high-frequency switching noise in a pulse-width-modulated transmit signal, which is fed into a line by a line driver by means of a transformer, comprising:

(a) a coil pair comprising two separate coils, the coil pair receiving the transmit signal from the line driver and delivering it to a first terminal of a primary winding of the transformer; and (b) at least one capacitor, which is interconnected between the first terminal of the primary winding of the transformer and a reference potential terminal.

43. Method for filtering out a high-frequency switching noise in a pulse-width-modulated transmit signal, which is fed into a line by a line driver by means of a transformer, wherein the switching noise is filtered out by means of a low-pass filter, which is formed by at least one capacitor, which is connected in parallel to a secondary winding of the transformer, and a stray inductivity of the transformer.

44. Method according to claim 43, wherein an overvoltage protection component is connected in parallel to the capacitor.

45. Method according to claim 43, wherein a series oscillating circuit is connected in parallel to the capacitor.

46. Method according to claim 43, wherein a resonance frequency of the series oscillating circuit corresponds to a switching frequency of the line driver.

47. Method for filtering out a high-frequency switching noise in a pulse-width-modulated transmit signal, which is fed into a line by a line driver by means of a transformer, wherein a common-mode choke receives the transmit signal from the line driver and delivers it to a first terminal of a primary winding of the transformer, and wherein the switching noise is filtered with a capacitor, which is connected in parallel to a secondary winding of the transformer.

48. Method according to claim 47, wherein the capacitor is a low-voltage capacitor.

49. Method according to claim 47, wherein the capacitor has a capacitance of less than 2.5 nF.

50. Method according to claim 47, wherein the capacitor, together with a stray inductivity of the transformer, forms an analogue low-pass filter.

* * * * *